United States Patent
Chen et al.

(10) Patent No.: US 9,953,118 B2
(45) Date of Patent: Apr. 24, 2018

(54) MODELING METHOD OF SPICE MODEL SERIES OF SOI FET

(75) Inventors: Jing Chen, Shanghai (CN); Qingqing Wu, Shanghai (CN); Jiexin Luo, Shanghai (CN); Zhan Chai, Shanghai (CN); Xi Wang, Shanghai (CN)

(73) Assignee: SHANGHAI INSTITUTE OF MICROSYSTEM AND INFORMATION TECHNOLOGY, CHINESE ACADEMY OF SCIENCES, Changning District, Shanghai (CN)

( * ) Notice: Subject to any disclaimer, the term of this patent is extended or adjusted under 35 U.S.C. 154(b) by 1167 days.

(21) Appl. No.: 13/696,437

(22) PCT Filed: Sep. 25, 2011

(86) PCT No.: PCT/CN2011/080144
§ 371 (c)(1),
(2), (4) Date: Nov. 6, 2012

(87) PCT Pub. No.: WO2012/126237
PCT Pub. Date: Sep. 27, 2012

(65) Prior Publication Data
US 2013/0054209 A1    Feb. 28, 2013

(30) Foreign Application Priority Data
Mar. 24, 2011   (CN) .......................... 2011 1 0072771

(51) Int. Cl.
*G06F 17/10*   (2006.01)
*G06F 17/50*   (2006.01)

(52) U.S. Cl.
CPC ................ *G06F 17/5036* (2013.01)

(58) Field of Classification Search
None
See application file for complete search history.

(56) References Cited

U.S. PATENT DOCUMENTS

| 2003/0055613 A1* | 3/2003 | Tsai ................................ 703/2 |
| 2009/0102501 A1* | 4/2009 | Guldi et al. .................. 324/765 |

OTHER PUBLICATIONS

Su, P., et al. "A body-contact SOI MOSFET model for circuit simulation." SOI Conference, 1999. Proceedings. 1999 IEEE International. IEEE, 1999.*

(Continued)

*Primary Examiner* — Omar F Fernandez Rivas
*Assistant Examiner* — Bijan Mapar
(74) *Attorney, Agent, or Firm* — Globals IP Services; Tianhua Gu

(57) ABSTRACT

The present invention provides a modeling method of a SPICE model series of a Silicon On Insulator (SOI) Field Effect Transistor (FET), where auxiliary devices are designed and fabricated, electrical property data is measured, intermediate data is obtained, model parameters are extracted based on the intermediate data, a SPICE model of an SOI FET of a floating structure is established, model parameters are extracted by using the intermediate data and data of the auxiliary devices, a macro model is complied, and a SPICE model of an SOI FET of a body leading-out structure is established. The modeling method provided in the present invention takes an influence of a parasitic transistor of a leading-out part in a body leading-out structure into consideration, and model series established by using the method can more accurately reflect actual operating conditions and electrical properties of the SOI FET of a body leading-out structure and the SOI FET of a floating structure, thereby improving fitting effects of the models.

7 Claims, 3 Drawing Sheets

(56) References Cited

OTHER PUBLICATIONS

Pin Su; Fung, S.K.H.; Tang, S.; Assaderaghi, F.; Chenming Hu, "BSIMPD: a partial-depletion SOI MOSFET model for deep-submicron CMOS designs," Custom Integrated Circuits Conference, 2000. CICC. Proceedings of the IEEE 2000, vol., No., pp. 197,200, 2000.*

BSIMSOIv4.4 Users Manual, Dec. 2010, BSIM Group, University of California, Berkeley, Retrieved from http://www-device.eecs.berkeley.edu/bsim/Files/BSIMSOI/bsimsoi4p4/BSIMSOIv4.4_UsersManual.pdf.*

*SPICE*, Wikipedia, https://en.wikipedia.org/wiki/SPICE (last updated Jun. 13, 2017; last visited Aug.17, 2017).*

* cited by examiner

MODELING METHOD OF SPICE MODEL SERIES OF SOI FET

CROSS REFERENCE TO RELATED PATENT APPLICATION

The present application is the US national stage of PCT/CN2011/080144 filed on Sep. 25, 2011, which claims the priority of the Chinese patent application No. 201110072771.6filed on Mar. 24, 2011, which application is incorporated herein by reference.

BACKGROUND OF THE PRESENT INVENTION

Field of Invention

The present invention relates to a modeling method of a SPICE model series of a field effect transistor (FET), and specifically to a modeling method of a SPICE model series of a Silicon On Insulator (SOI) FET, belonging to the field of micro-electronic device modeling.

Description of Related Arts

A Metal Oxide Semiconductor Field Effect Transistor (MOSFET) is a four-port semiconductor device, where different excitation is applied to each port, and a drain current of the device also changes accordingly. An input/output mathematical expression is obtained by establishing a mathematical model of the device, and circuit designers use the model to perform SPICE emulation of circuit design. Currently, multiple mathematical models with respect to the MOSFET are proposed, and each model includes a large number of parameters.

An SOI FET (also referred to as an MOSFET) generally has two application modes. In one application mode, a body leading-out structure (including T-shaped gate leading-out structure and an H-shaped gate leading-out structure) exists, and in the other application mode, no body leading-out structure (that is, a floating structure) exists. FIG. 1 is a schematic diagram of a layout of a device of a T-shaped gate leading-out structure. When a voltage is applied to a gate, a substrate below the T-shaped gate 102 is reversed to form a conductive channel. Currently, it is generally considered that the properties of the channel are completely consistent with those of a channel below a normal gate 101, so the T-shaped gate 102 is only equivalent to that an effective width of the device is increased. However, such a processing manner is extremely simple, and is even faulty in the current process. The device of a body leading-out structure may even present some characteristics that the model fails to cover.

The T-shaped gate 102 is not singly doped, where one half is doped with N-type impurities and the other half is doped with P-type impurities. The electrical properties of the T-shaped gate 102 are totally different from those of the singly doped normal gate 101. Moreover, when modeling (referred to establishing a SPICE model, the same below) is performed on the floating structure, model parameters, related to the body, of the device need to be extracted through a device of a body leading-out structure. If the leading-out part (that is, the conductive channel below the T-shaped gate 102) is not taken into consideration and test data of the device of a body leading-out structure is directly used to extract the model parameters, it is difficult for the established SPICE model of a floating structure to accurately express some properties of the device, and even a fault occurs during emulation.

In view of this, the present invention provides an accurate modeling method of a SPICE model series of an SOI FET, so as to more accurately and effectively model and emulate the SOl FET.

SUMMARY OF THE PRESENT INVENTION

A technical problem to be solved by the present invention is to provide a modeling method of a SPICE model series of an SOI FET.

In order to solve the foregoing technical problem, the present invention adopts the following technical solutions.

A modeling method of a SPICE model series of an SOI FET comprises the following steps:

1) designing and fabricating a plurality of devices of a body leading-out structure and of different sizes, a plurality of devices of a floating structure and of different sizes, and a plurality of auxiliary devices only comprising body leading-out parts in the devices of a body leading-out structure and;

2) measuring various electrical property data of the devices of a body leading-out structure, the devices of a floating structure, and the auxiliary devices respectively;

3) subtracting the electrical property data of the auxiliary devices of corresponding sizes from the electrical property data of all the devices of a body leading-out structure in the same test conditions, and recording the subtraction result as intermediate data;

4) extracting all model parameters of the devices of a body leading-out structure in a SPICE model equation of the SOI FET by using the intermediate data, to establish a first model;

5) extracting all model parameters of the devices of a body leading-out structure in the SPICE model equation of the SOI FET by using the electrical property data of the auxiliary devices, to establish a second model;

6) writing a macro-model formed by the first model and the second model in a parallel connection, and establishing a SPICE model of an SOI FET of a body leading-out structure; and 7) based on the first model established in step 4) and by using the electrical property data of the devices of a floating structure, extracting all model parameters of devices without a body leading-out structure in the SPICE model equation of the SOI FET, so as to obtain a SPICE model of an SOI FET of a floating structure.

As a preferred solution of the present invention, in step 1), the device of a body leading-out structure is a device of a T-shaped gate leading-out structure.

As a preferred solution of the present invention, the various electrical property data tested in step 2) comprises alternating current (AC) electrical properties and direct current (DC) electrical properties.

As a preferred solution of the present invention, in step 4), the SPICE model equation of the SOI FET is a BSIMSOI3 model equation, a BSIM4SOI model equation, or a PSPSOI model equation.

As a preferred solution of the present invention, in step 5), the SPICE model equation of the SOI FET is a BSIMSOI3 model equation, a BSIM4SOI model equation, or a PSPSOI model equation.

As a preferred solution of the present invention, in step 6), verilog-A is adopted to write the macro-model.

As a preferred solution of the present invention, the first model and the second model in the macro-model written in step 6) share four ends: a gate, a source, a drain, and a body.

The beneficial effects of the present invention are as follows:

In the modeling method provided in the present invention, the auxiliary devices only comprising the body leading-out parts in the devices of a body leading-out structure are designed and fabricated, the electrical property data of the auxiliary devices is tested, and the data of the auxiliary devices is subtracted from the test data of the devices of a body leading-out structure, to obtain the intermediate data. The intermediate data can more accurately reflect electrical properties of a functional transistor part of a main body in the device of a body leading-out structure, and eliminate interference of a parasitic transistor of the body leading-out part. The model parameters of the devices of a floating structure that are extracted based on the intermediate data is more accurate than those in the prior art and have a better fitting effect. The macro-model formed by the first model extracted through the intermediate data and the second model extracted through the auxiliary devices that are in a parallel connection is written, which can completely reflect the influence of physical structural parts (that is, a body leading-out part and a main body part) of the device of a body leading-out structure on the electrical properties of the device.

Therefore, the modeling method provided in the present invention takes an influence of a parasitic transistor in the body leading-out structure into consideration. A model series established through the method can more accurately reflect actual operating conditions and electrical properties of an SOI FET of a body leading-out structure and an SOI FET of a floating structure, and facilitates reliability of emulation of SOI circuit design, thereby having significant meanings for the development of the SOI circuit.

DETAILED DESCRIPTION OF THE PREFERRED EMBODIMENTS

A device structure consistent with the present invention is further described in the following with reference to the accompanying drawings, and the accompanying drawings are not draw to scale for ease of showing.

Figure 1:
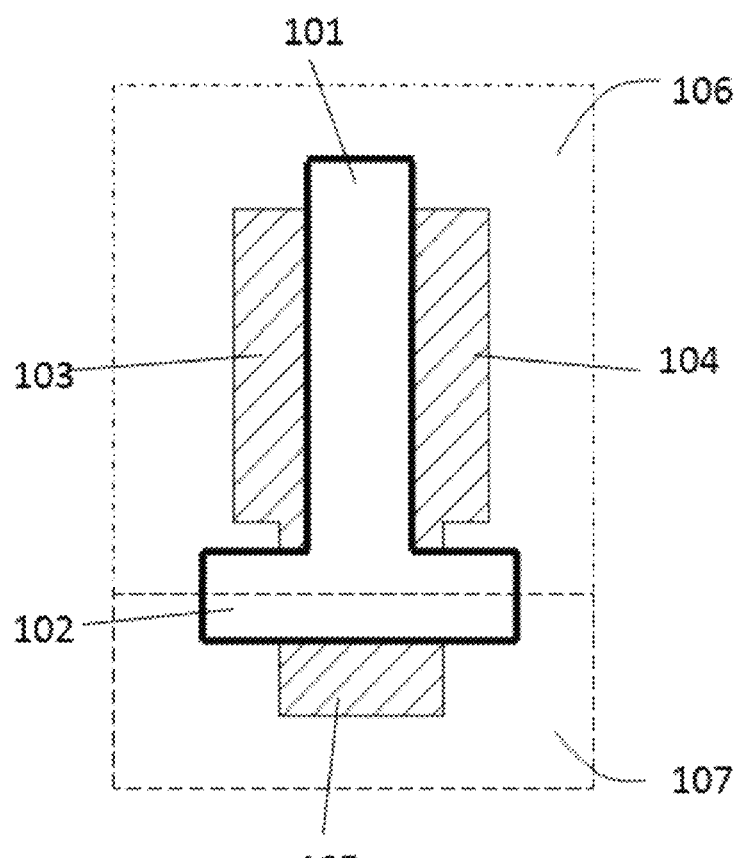
FIG. 1 is a schematic diagram of an SOI FET of a T-shaped gate leading-out structure according to an embodiment.

By testing and researching an SOI FET of a body leading-out structure, the inventor of the present invention finds that, in an SOI FET of a T-shaped leading-out structure, as shown in FIG. 1, a substrate below a T-shaped gate 102 of a body leading-out part is also reversed to form a conductive channel, and properties of the channel are inconsistent with those of a channel below a normal gate 101 of a main body part. The T-shaped gate 102 is not singly doped, where one half is doped with N-type impurities and the other half is doped with P-type impurities. The electrical properties of the T-shaped gate 102 are totally different from those of the singly doped normal gate 101. Currently, during emulation modeling, generally, the T-shaped gate 102 is only equivalent to that an effective width of the device is increased. It can be seen that, an electrical model established in this manner is not accurate, and an actual device may present some properties that an existing SPICE model fails to cover. Moreover, when SPICE modeling is performed on the floating structure, model parameters, related to the body, of the device need to be extracted through a device of a body leading-out structure. If the leading-out part is not taken into consideration, and test data of the device of a body leading-out structure is directly used to extract the model parameters, it is difficult for the established SPICE model of a floating structure to accurately express some properties of the device, and even a fault occurs during emulation.

Based on the foregoing analysis and research, the inventor of the present invention proposes a more accurate modeling method of a SPICE model series of an SOI FET, where the SPICE model series of an SOI FET includes a SPICE model of an SOI FET of a body leading-out structure and a SPICE model of an SOI FET of a floating structure. Generally, relevant model parameters are extracted by testing data of the device and by using a model equation, so as to obtain a complete mathematical model. A modeling method consistent with the present invention specifically includes the following steps.

Figure 2:
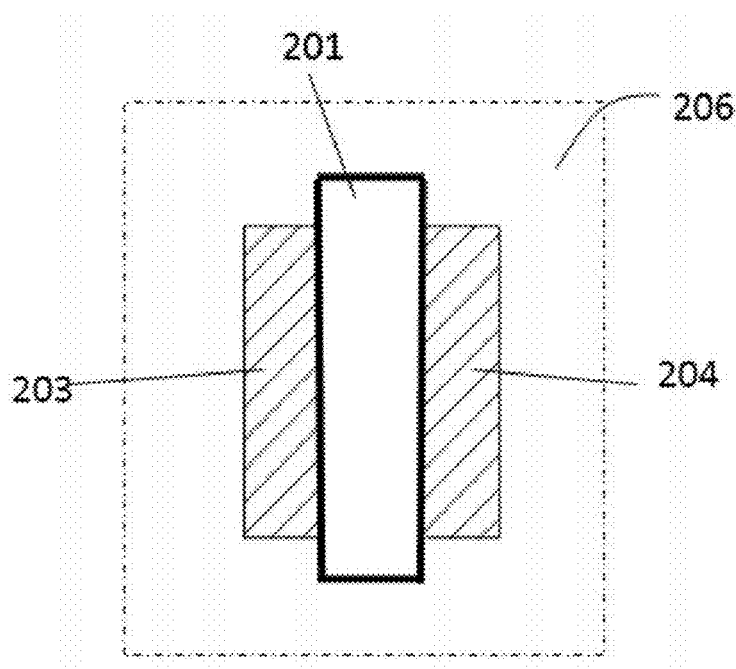
FIG. 2 is a schematic diagram of an SOI FET of a floating structure according to an embodiment.
Figure 3:
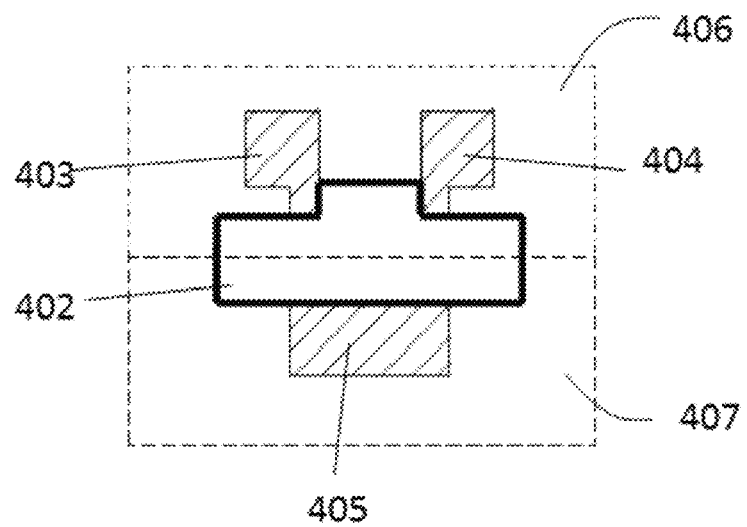
FIG. 3 is a schematic diagram of an auxiliary device according to an embodiment.

1) A plurality of devices of a body leading-out structure (a T-shaped gate is taken as an example) and of different sizes are designed and fabricated, as shown in FIG. 1, where N-type doping of a normal gate 101, a source 102, and a drain 103 is defined (an NMOS is taken as an example, the same below) by a mask 106, P-type doping of a body 104 is defined by a mask 107, and doping polarities of the T-shaped gate are defined by the mask 106 and the mask 107 together. A plurality of devices of a floating structure and of different sizes are designed and fabricated, as shown in FIG. 2, where N-type doping of a normal gate 201, a source 203, and a drain 104 is defined by a mask 206. A plurality of auxiliary devices only including the T-shaped gate 102 and of different sizes are designed and fabricated, as shown in FIG. 3, where N-type doping of a source 403 and a drain 404 is defined by a mask 406, P-type doping of a body 405 is defined by the mask 407, and doping polarities of the T-shaped gate are defined by the mask 406 and the mask 407 together; according to applications, a width of the auxiliary device is fixed to be a certain fixed value.

2) Various AC electrical properties and DC electrical properties, including Cgg_Vgs, Cgc_Vgs_Vbs, Ids_Vgs_Vbs, Ids_Vds_Vgs, and Ids_Vgs_Vds, of the foregoing three devices are respectively measured by using a semiconductor parameter measurement instrument (for example, Agilent 4156, Agilent B1500A, Keithley 4200, or the like).

Figure 4:
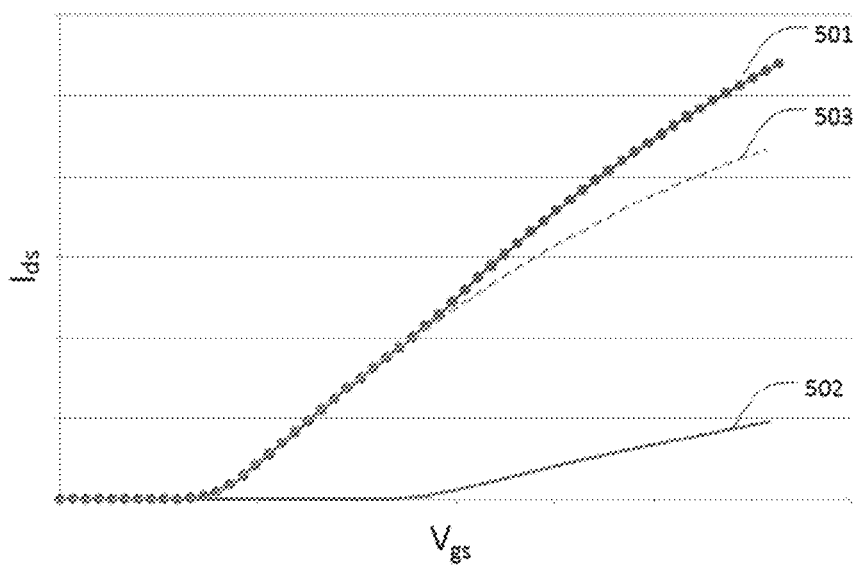
FIG. 4 is a schematic diagram of test data for obtaining intermediate data according to an embodiment.

3) The electrical property data of the auxiliary devices of corresponding sizes in the same test conditions is subtracted from the electrical property data of all the devices of a body leading-out structure, and recording the subtraction result as intermediate data. For example, data of auxiliary devices with a length of L is subtracted from data of all devices of a body leading-out structure and with a length of L, and the subtraction result is recorded as intermediate data. As shown in FIG. 4, a curve 501 indicates data of devices of a body leading-out structure, a curve 502 indicates data of auxiliary devices, a curve 503 indicates intermediate data obtained by subtracting the curve 502 from the curve 501.

4) Model parameters are extracted from the intermediate data by using a proper SPICE model equation (for example, BSIMSOI3, BSIM4SOI1, PSPSOI, or the like), to establish a first model. BSIM4SOI is taken as an example. If a parameter nbc is set to 1, and the device is regarded as a device of a body leading-out structure, a proper extraction flow is selected to extract all model parameters.

5) Model parameters are extracted from the data of the auxiliary devices by using a proper SPICE model equation (for example, BSIMSOI3, BSIM4SOI, PSPSOI, or the like), to establish a second model. BSIM4SOI is taken as an example. If a parameter nbc is set to 1, and the device is regarded as a device of a body leading-out structure, a proper extraction flow is selected to extract all model parameters.

6) A macro-model is written by using Verilog-A, where the macro-model is formed by the first model and the second model in a parallel connection, and is recorded as a SPICE model of the SOI FET of a body leading-out structure. The second model represents a parasitic transistor of a body leading-out part (below the T-shaped gate 102) in the SOI FET of a body leading-out structure, the first model represents a normal transistor of a main body part (below the normal gate 102), and the two transistors share four ends: a gate, a source, a drain, and a body; therefore, electrical properties of the SOI FET of a body leading-out structure can be more accurately and completely reflected.

7) Model parameters are extracted from the data of the devices of a floating structure by using a proper SPICE model (for example, BSIMSOI3, BSIM4SOI, PSPSOI, or the like). BSIM4SOI is taken as an example. If the first model obtained in step 4) is used as an initial model of the device of a floating structure, a parameter nbc is set to 1, and the device is regarded as a device without a body leading-out structure, a proper extraction flow is selected to extract all model parameters, so as to directly obtain a SPICE model of the SOI FET of a floating structure. In the parameters extracted by using the intermediate data, interference data of a parasitic transistor of the body leading-out part is eliminated, which can more accurately reflect electrical properties of the SOI FET of a floating structure, thereby improving fitting effects of the models.

It can be seen that, the modeling method provided in the present invention takes an influence of a parasitic transistor in the body leading-out structure into consideration. A model series established through this method can more accurately reflect actual operating conditions and electrical properties of an SOI FET of a body leading-out structure and an SOI FET of a floating structure, and facilitate reliability of emulation of SOI circuit design, thereby having significant meanings for the development of the SOI circuit.

The above embodiments merely illustrate the principle and efficacy of the present invention exemplarily, and are not intended to limit the present invention. Any person skilled in the art can make modifications to the above embodiments without departing from the spirit and scope of the present invention. Therefore, the protection scope of the present invention is listed in the claims.

What is claimed is:

1. A modeling method of a SPICE model series of a Silicon On Insulator (SOI) Field Effect Transistor (FET), comprising the following steps:
   1) designing and fabricating:
   a plurality of devices of a body leading-out structure of the SOI EFT with different sizes,
   a plurality of devices of a floating structure-of the SOI EFT with different sizes, and
   a plurality of auxiliary devices of the SOI EFT only comprising body leading-out parts in the devices of a body leading-out structure;
   2) measuring various electrical property data of:
   the devices of a body leading-out structure of the SOI EFT,
   the devices of a floating structure of the SOI EFT, and
   the auxiliary devices of the SOI EFT respectively;
   3) subtracting the electrical property data of the auxiliary devices of the SOI EFT of corresponding sizes from the electrical property data of all the devices of a body leading-out structure of the SOI EFT in the same test conditions, and recording the subtraction result as intermediate data;
   4) extracting all model parameters of the devices of a body leading-out structure in a SPICE model equation of an SOI FET by using the intermediate data, to establish a first model;
   5) extracting all model parameters of the devices of a body leading-out structure in the SPICE model equation of the SOI FET by using the electrical property data of the auxiliary devices, to establish a second model;
   6) writing a macro-model formed by the first model and the second model in a parallel connection, and establishing a SPICE model of the SOI FET of a body leading-out structure; and
   7) based on the first model established in step 4) and by using the electrical property data of the devices of a floating structure, extracting all model parameters of devices without a body leading-out structure in the SPICE model equation of the SOI FET, so as to obtain a SPICE model of an SOI FET of a floating structure.

2. The modeling method of a SPICE model series of SOI FET as in claim 1, wherein the device of a body leading-out structure in step 1) is a device of a T-shaped gate leading-out structure.

3. The modeling method of a SPICE model series of SOI FET as in claim 1, wherein the various electrical property data tested in step 2) comprises alternating current (AC) electrical properties and direct current (DC) electrical properties.

4. The modeling method of a SPICE model series of SOI FET as in claim 1, wherein in step 4), the SPICE model equation of the SOI FET is a BSIMSOI3 model equation, a BSIM4SOI model equation, or a PSPSOI model equation.

5. The modeling method of a SPICE model series of SOI FET as in claim 1, wherein in step 5), the SPICE model equation of the SOI FET is a BSIMSOI3 model equation, a BSIM4SOI model equation, or a PSPSOI model equation.

6. The modeling method of a SPICE model series of SOI FET as in claim 1, wherein in step 6), Verilog-A is adopted to write the macro-model.

7. The modeling method of a SPICE model series of SOI FET as in claim 1, wherein the first model and the second model in the macro-model written in step 6) share four ends: a gate, a source, a drain, and a body.

* * * * *